(12) United States Patent
Juan et al.

(10) Patent No.: US 7,418,198 B2
(45) Date of Patent: Aug. 26, 2008

(54) UNDERWATER HOUSING FOR ELECTRONIC DEVICE

(75) Inventors: Paul Juan, Kaohsiung (TW); Kuen-Yu Huang, Hsin-Chu (TW)

(73) Assignee: National Applied Research Laboratories National Center for High Center for High-Performance Computing, Hsinchu (TW)

( * ) Notice: Subject to any disclaimer, the term of this patent is extended or adjusted under 35 U.S.C. 154(b) by 370 days.

(21) Appl. No.: 11/392,512

(22) Filed: Mar. 29, 2006

(65) Prior Publication Data

US 2006/0263075 A1 Nov. 23, 2006

(30) Foreign Application Priority Data

May 17, 2005 (TW) .............................. 94115910 A

(51) Int. Cl.
*G03B 17/08* (2006.01)
*H04N 7/18* (2006.01)

(52) U.S. Cl. .......................................... 396/25; 348/81
(58) Field of Classification Search .................. 396/25, 396/27, 29; 348/81, 373; 604/192
See application file for complete search history.

(56) References Cited

U.S. PATENT DOCUMENTS

| 6,507,700 B1 * | 1/2003 | Takekuma et al. ............ 396/25 |
| 2005/0111222 A1 * | 5/2005 | Olsson et al. ................ 362/267 |

* cited by examiner

*Primary Examiner*—Rodney E Fuller
(74) *Attorney, Agent, or Firm*—Ladas & Parry LLP

(57) ABSTRACT

An underwater housing includes a housing body for containing an electronic device, a seal cap for sealing a rear end opening of the housing body, and a spacer member for dividing a space between the housing body and the seal cap into a cable chamber and an accommodating chamber. The seal cap includes an annular front cap element connected fixedly and sealingly to the housing body, and a rear cap element disposed fixedly and fittingly within the rear end of the front cap element. The rear cap element has a hole permitting an electrical cable to sealingly extend therethrough. The spacer member includes a spacer body disposed sealingly in said seal cap, and a plurality of conductive terminals extending sealingly through the spacer body and interconnecting electrically the electronic device and the electrical cable.

6 Claims, 3 Drawing Sheets

UNDERWATER HOUSING FOR ELECTRONIC DEVICE

CROSS-REFERENCE TO RELATED APPLICATION

This application claims priority of Taiwanese Application No. 094115910, filed on May 17, 2005.

BACKGROUND OF THE INVENTION

1. Field of the Invention

This invention relates to an underwater container, and more particularly to an underwater housing for containing an electronic device, such as a photographic camera.

2. Description of the Related Art

Referring to FIG. 1, a conventional underwater housing is adapted for containing a photographic camera (not shown), and includes a housing body 1, a seal cap 2, and an annular water seal 3. The photographic camera is contained within the housing body 1. An externally threaded rear end of the housing body 1 engages a threaded hole in a front end of the seal cap 2. An O-ring 10 is clamped between the housing body 1 and the seal cap 2 so as to establish a watertight seal therebetween. An electrical cable 31 extends through a hole 21 in the seal cap 2, and is coupled electrically to the photographic camera. The water seal 3 is disposed between the electrical cable 31 and the seal cap 2 so as to establish a watertight seal therebetween. However, an outer surface of the electrical cable 31 undergoes erosion after a long period of use, such that a gap is formed between the electrical cable 31 and the seal cap 2. The gap allows water to enter the housing and thereby come into contact with the electronic device. As such, an assembly of the underwater housing and the photographic camera cannot be used for a long period.

SUMMARY OF THE INVENTION

The object of this invention is to provide an underwater housing for an electronic device, which can effectively prevent water from gaining access to a portion of the housing containing the electronic device.

According to this invention, an underwater housing includes a housing body for containing an electronic device, a seal cap for sealing a rear end opening of the housing body, and a spacer member for dividing a space between the housing body and the seal cap into a cable chamber and an accommodating chamber. The seal cap includes an annular front cap element connected fixedly and sealingly to the housing body, and a rear cap element disposed fixedly and fittingly within a rear end of the front cap element. The rear cap element has a hole permitting an electrical cable to sealingly extend therethrough. The spacer member includes a spacer body disposed sealingly in the seal cap, and a plurality of conductive terminals extending sealingly through the spacer body and interconnecting electrically the electronic device and the electrical cable. Due to the presence of the spacer member, if a gap is formed between the electrical cable and the seal cap as a result of erosion of an outer surface of the electrical cable, water can only flow into the cable chamber via the gap and is unable to enter the accommodating chamber. This ensures that the electronic device is kept dry.

BRIEF DESCRIPTION OF THE DRAWINGS

These and other features and advantages of this invention will become apparent in the following detailed description of a preferred embodiment of this invention, with reference to the accompanying drawings, in which.

DETAILED DESCRIPTION OF THE PREFERRED EMBODIMENT

Figure 1:
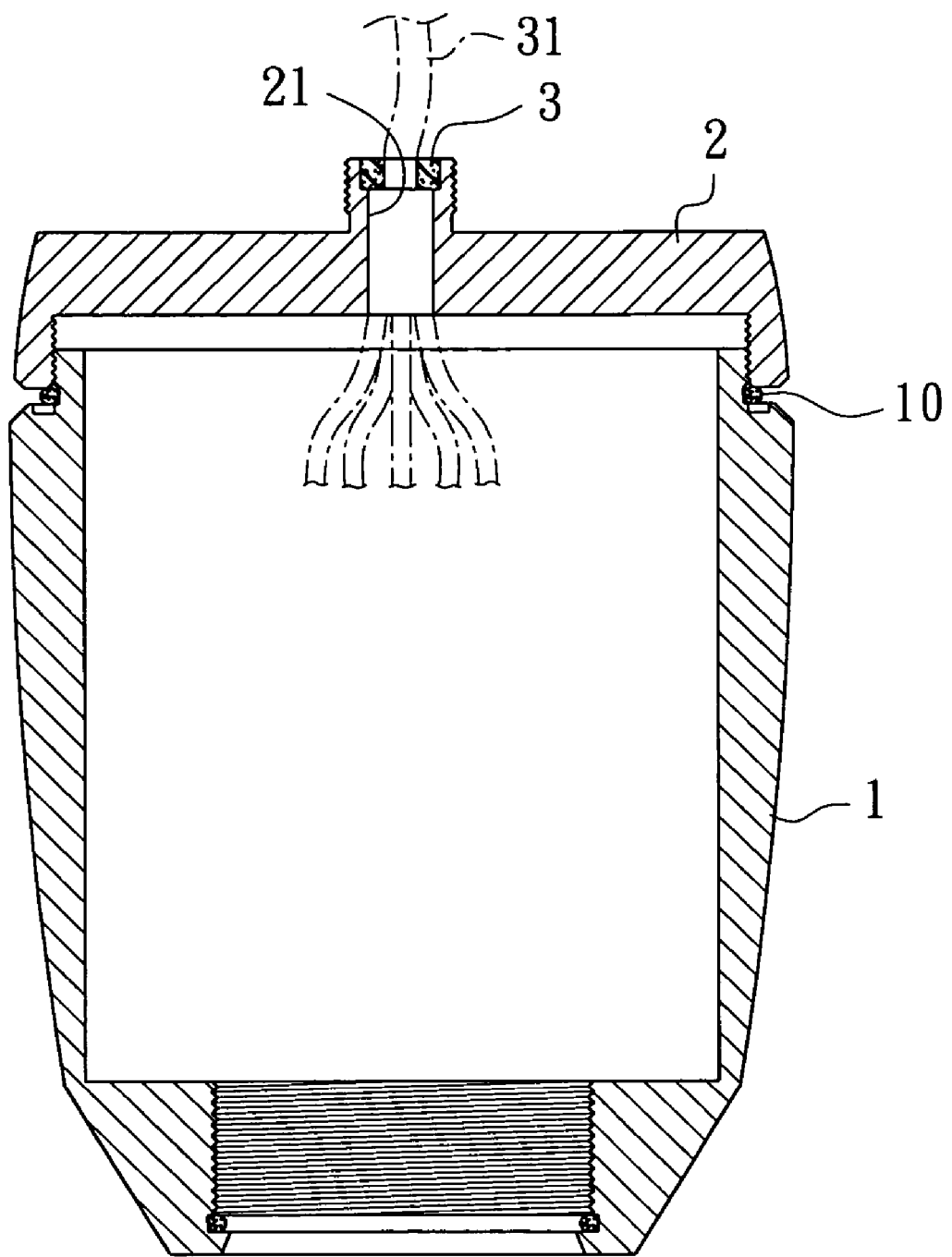
FIG. 1 is a sectional view of a conventional underwater housing for a photographic camera.
Figure 2:
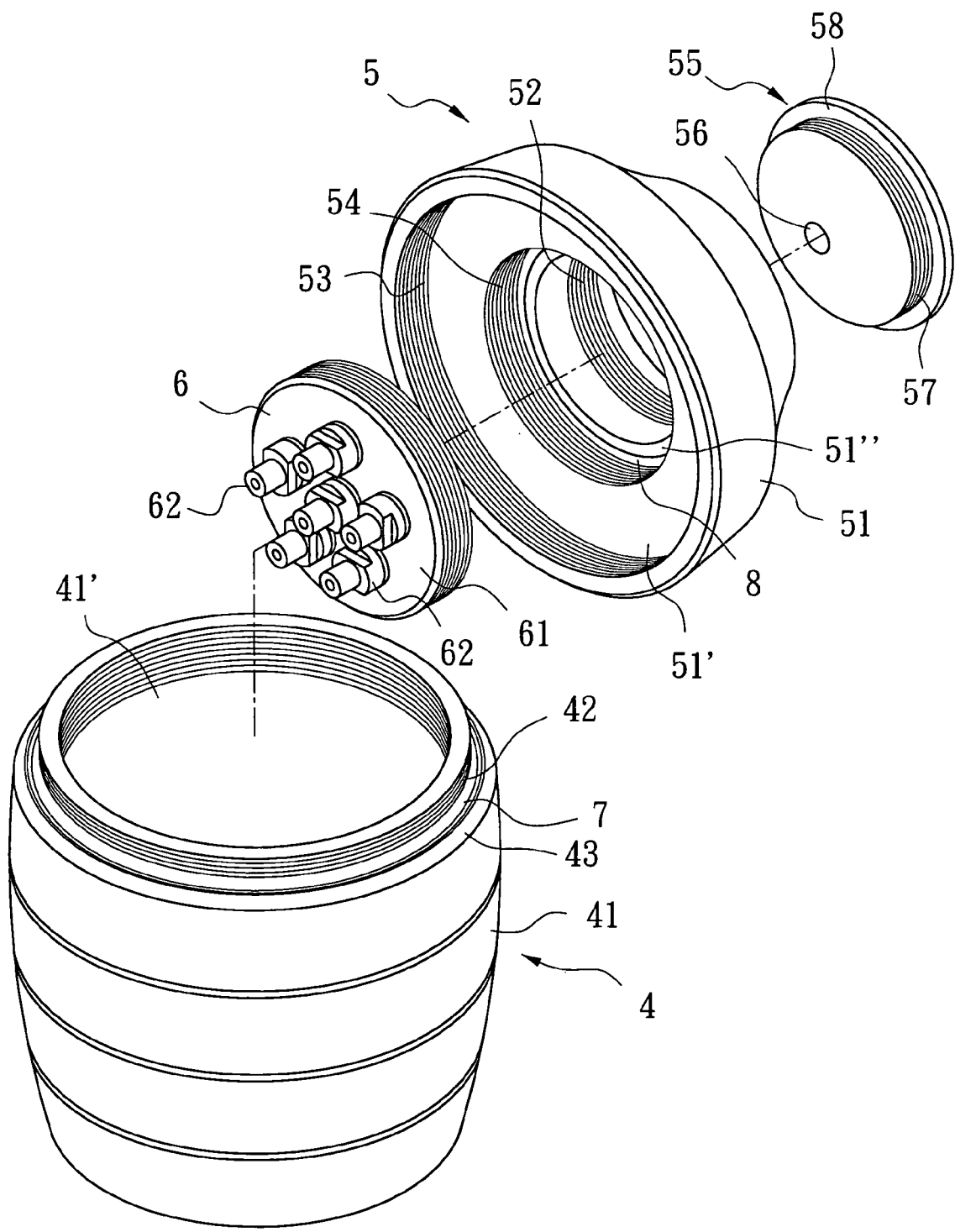
FIG. 2 is an exploded perspective view of the preferred embodiment of an underwater housing for an electronic device according to this invention.
Figure 3:
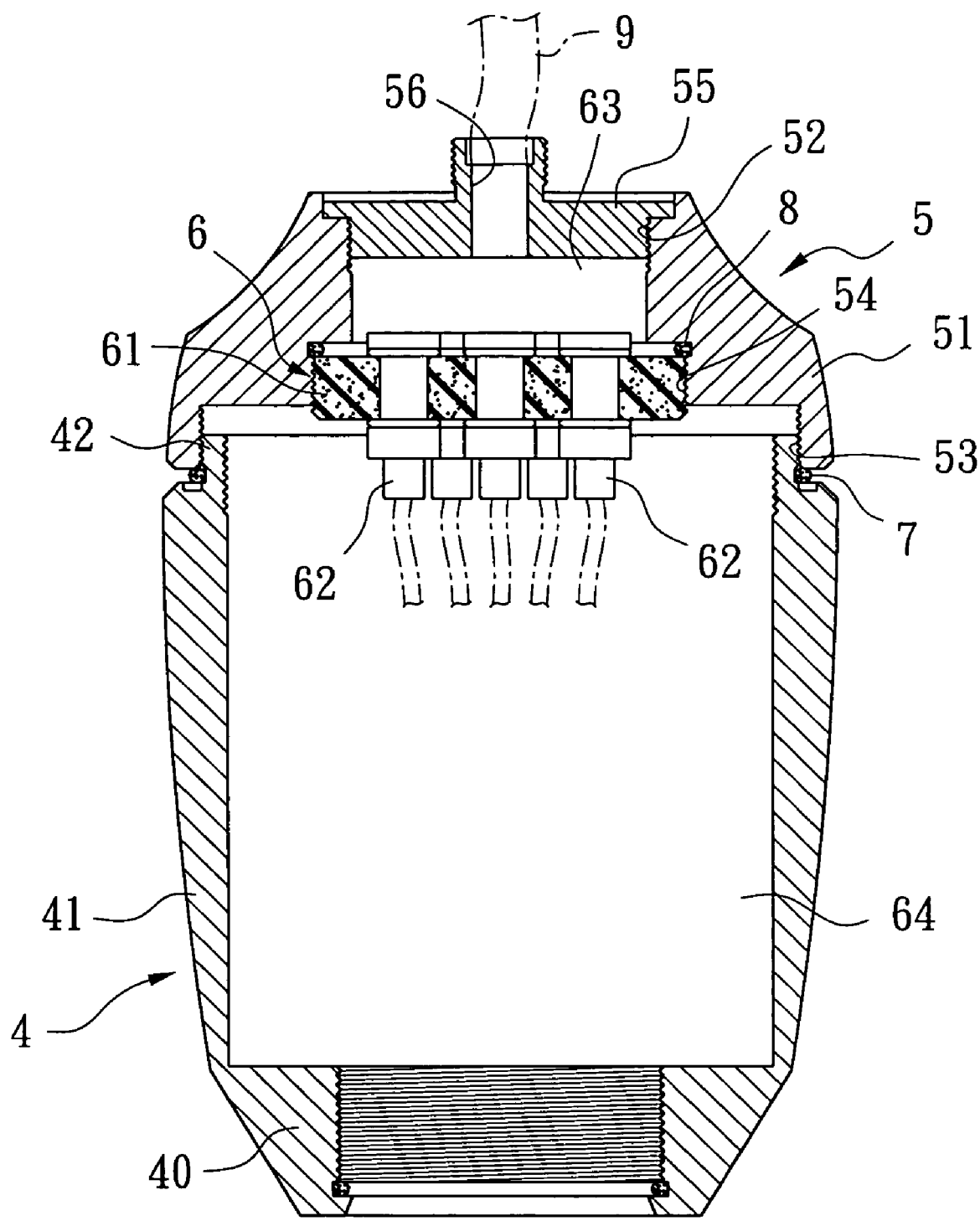
FIG. 3 is a sectional view of the preferred embodiment.

Referring to FIGS. 2 and 3, the preferred embodiment of an underwater housing for an electronic device (not shown), such as a photographic camera, includes a housing body 4, a seal cap 5, a spacer member 6, an annular first water seal 7, and an annular second water seal 8. The electronic device is coupled electrically to an electrical cable 9 extending outwardly of the underwater housing. The seal cap 5 is made of metal. The spacer member 6 includes a spacer body 61 made of rubber, and a plurality of conductive terminals 62.

The housing body 4 is located in front of the electrical cable 9, and is adapted to contain the electronic device. The housing body 4 includes a front end wall 40, and an annular surrounding wall 41 extending rearwardly from an outer periphery of the front end wall 40 to define a rear end opening 41'. The surrounding wall 41 has an externally threaded engagement portion 42 at a rear end thereof. In this embodiment, the front end wall 40 has a wall body made of metal and formed integrally with the front end wall 40, and a transparent plate (not shown) permitting the electronic device to take photographs therethrough. An outer surface of the housing body 4 is formed with a shoulder portion 43 disposed in front of and adjacent to the engagement portion 42.

The seal cap 5 includes an annular front cap element 51 and a rear cap element 55. The front cap element 51 has a rear end formed with a rear engagement portion 52, a front end formed with a front engagement portion 53, and an intermediate portion formed with an intermediate engagement portion 54 disposed between the front and rear engagement portions 53, 52. The front, intermediate, and rear engagement portions 53, 54, 52 are disposed on an annular inner surface of the front cap element 51, and are internally threaded. The front engagement portion 53 is connected threadedly to the engagement portion 42 of the housing body 4 so as to interconnect the front cap element 51 and the housing body 4. An annular inner surface of the front cap element 51 is formed with a front shoulder portion 51' disposed behind and adjacent to the front engagement portion 53, and a rear shoulder portion 51" disposed behind and adjacent to the intermediate engagement portion 54. The first water seal 7 is clamped between the shoulder portion 43 of the outer surface of the housing body 4 and the front shoulder portion 51' of the inner surface of the front cap element 51 so as to establish a watertight seal between the front cap element 51 and the housing body 4.

The rear cap element 55 is formed with a central hole 56 permitting the electrical cable 9 to extend therethrough. An annular water seal (not shown) is disposed between the electrical cable 9 and the rear cap element 55 in a known manner so as to establish a watertight seal therebetween. In this embodiment, the rear cap element 55 is mushroom-shaped, and has an externally threaded front portion 57 and a rear flange portion 58 extending radially and outwardly therefrom and disposed behind the front portion 57. The front portion 57 is connected threadedly to the rear engagement portion 52 of the front cap element 51 so as to interconnect the front and rear cap elements 51, 55 fixedly. As such, the rear cap member 55 is disposed fixedly and fittingly within the rear end of the front cap element 51. The rear flange portion 58 has a front side surface abutting against a rear end surface of the front cap element 51.

The spacer body 61 is externally threaded, and is connected threadedly to the intermediate engagement portion 54 of the front cap element 51 so as to be fixed within the front cap element 51. Since the spacer body 61 is made of rubber, a watertight seal is established between the spacer body 61 and the front cap element 51. As such, the spacer member 6 divides a space between the housing body 4 and the seal cap 5 into a cable chamber 63 and an accommodating chamber 64. The cable chamber 63 is disposed between the spacer body 61 and the rear cap element 55. The accommodating chamber 64 is disposed between the front end wall 40 and the spacer body 61. Each of conductive terminals 62 extends sealingly through the spacer body 61, and has front and rear ends coupled respectively and electrically to the electrical cable 9 and the electronic device so as to establish electrical connection between the electronic device and the electrical cable 9. The second water seal 8 is clamped between a rear side surface of the spacer member 6 and the rear shoulder portion 51" of the front cap element 51 so as to establish a watertight seal therebetween. Due to the presence of the spacer member 6, if a gap (not shown) is formed between the electrical cable 9 and the seal cap 5 as a result of erosion of an outer surface of the electrical cable 9, water can only flow into the cable chamber 63 via the gap and is unable to enter the accommodating chamber 64. This ensures that the electronic device is kept dry.

With this invention thus explained, it is apparent that numerous modifications and variations can be made without departing from the scope and spirit of this invention. It is therefore intended that this invention be limited only as indicated by the appended claims.

We claim:

1. An underwater housing for an electronic device, the electronic device being coupled electrically to an electrical cable extending outwardly of said underwater housing, said underwater housing comprising:

a housing body adapted to be located in front of the electrical cable and adapted to contain the electronic device and including a front end wall, and an annular surrounding wall extending rearwardly from an outer periphery of said front end wall to define a rear end opening, said surrounding wall having an engagement portion disposed at a rear end thereof;

a seal cap including an annular front cap element having a rear end formed with a rear engagement portion, a front end formed with a front engagement portion, and an intermediate portion formed with an intermediate engagement portion disposed between said front and rear engagement portions, said front, intermediate, and rear engagement portions being disposed on an annular inner surface of said front cap element, said front engagement portion being connected fixedly to said engagement portion of said housing body such that a watertight seal is established therebetween, and a rear cap element connected fixedly to said rear engagement portion of said front cap element and disposed fixedly and fittingly within said rear end of said front cap element, said rear cap element being formed with a hole adapted to permit the electrical cable to extend therethrough such that a watertight seal is established therebetween; and a spacer member disposed in said seal cap and including a spacer body and a plurality of conductive terminals, said spacer body being connected fixedly to said intermediate engagement portion of said seal cap such that a watertight seal is established therebetween so as to divide a space between said housing body and said seal cap into a cable chamber and an accommodating chamber, said accommodating chamber being disposed between said front end wall of said housing body and said spacer body, said cable chamber being disposed between said spacer body and said rear cap element, each of said conductive terminals extending sealingly through said spacer body and having two opposite ends adapted to be coupled respectively and electrically to the electrical cable and the electronic device so as to establish electrical connection between the electronic device and the electrical cable.

2. The underwater housing as claimed in claim 1, wherein said engagement portion of said surrounding wall of said housing body is externally threaded, and said front engagement portion of said front cap element of said seal cap is internally threaded, and is connected threadedly to said engagement portion of said surrounding wall of said housing body.

3. The underwater housing as claimed in claim 2, wherein said housing body further has an annular outer surface that is formed with a shoulder portion disposed in front of and adjacent to said engagement portion of said housing body, said front cap element having an annular inner surface that is formed with a front shoulder portion disposed behind and adjacent to said front engagement portion, said underwater housing further comprising an annular water seal clamped between said shoulder portion of said outer surface of said housing body and said front shoulder portion of said inner surface of said front cap element so as to establish a watertight seal between said housing body and said front cap element.

4. The underwater housing as claimed in claim 1, wherein said rear engagement portion of said front cap element of said seal cap is internally threaded, said rear cap element being mushroom-shaped and having an externally threaded front portion connected threadedly to said rear engagement portion of said front cap element, and a rear flange portion extending radially and outwardly therefrom and disposed behind said externally threaded front portion, said rear flange portion having a front side surface abutting against a rear end surface of said front cap element.

5. The underwater housing as claimed in claim 1, wherein said intermediate engagement portion of said front cap element is internally threaded, said spacer member being externally threaded and being connected threadedly to said intermediate engagement portion of said front cap element.

6. The underwater housing as claimed in claim 5, wherein said front cap element has an annular inner surface that is formed with a rear shoulder portion disposed behind and adjacent to said intermediate engagement portion, said spacer body having a rear side surface, said underwater housing further comprising an annular water seal clamped between said rear side surface of said spacer member and said rear shoulder portion of said inner surface of said front cap element so as to establish a watertight seal between said spacer member and said front cap element.

* * * * *

UNITED STATES PATENT AND TRADEMARK OFFICE
CERTIFICATE OF CORRECTION

PATENT NO. : 7,418,198 B2 Page 1 of 1
APPLICATION NO. : 11/392512
DATED : August 26, 2008
INVENTOR(S) : Paul Juan et al.

It is certified that error appears in the above-identified patent and that said Letters Patent is hereby corrected as shown below:

On Title page, Item (73) Assignee:

Delete "National Applied Research Laboratories National Center for High Center for High-Performance Computing" and insert -- National Applied Research Laboratories National Center for High-Performance Computing --

Signed and Sealed this

Sixth Day of January, 2009

JON W. DUDAS
*Director of the United States Patent and Trademark Office*